(12) United States Patent
Kari et al.

(10) Patent No.: US 7,447,080 B2
(45) Date of Patent: Nov. 4, 2008

(54) METHOD AND DEVICE FOR CHECKING THE EXECUTION OF A WRITE COMMAND FOR WRITING IN A MEMORY

(75) Inventors: Ahmed Kari, Aix en Provence (FR);
Christophe Moreaux, Simiane (FR);
David Naura, Aix en Provence (FR);
Pierre Rizzo, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 18 days.

(21) Appl. No.: 11/610,628

(22) Filed: Dec. 14, 2006

(65) Prior Publication Data

US 2007/0153581 A1 Jul. 5, 2007

(30) Foreign Application Priority Data

Dec. 14, 2005 (FR) .................................. 05 12631

(51) Int. Cl.
*G11C 16/04* (2006.01)
(52) U.S. Cl. ............................ 365/185.22; 365/185.29; 365/185.3
(58) Field of Classification Search ............ 365/185.22, 365/185.29, 185.3
See application file for complete search history.

(56) References Cited

U.S. PATENT DOCUMENTS

| 5,930,179 | A | 7/1999 | Cha ....................... 365/189.07 |
| 6,798,713 | B1 | 9/2004 | Yearsley et al. .......... 365/238.5 |
| 2002/0083385 | A1 | 6/2002 | Dover et al. ................. 714/719 |
| 2004/0141379 | A1 | 7/2004 | La Malfa et al. ........ 365/185.33 |

FOREIGN PATENT DOCUMENTS

EP 0455238 B1 11/1991

*Primary Examiner*—Thong Q Le
(74) *Attorney, Agent, or Firm*—Lisa K. Jorgenson; Dennis M. de Guzman; Seed IP Law Group PLLC

(57) ABSTRACT

A method for executing a write command for writing a binary word in a programmable memory, comprises writing each of the bits in a programmed state of a binary word to be written in a corresponding memory cell of the memory, reading each bit of the word written in the memory corresponding to a bit in the programmed state of the word to be written, comparing each bit in the programmed state of the word to be written with a corresponding bit read in the memory, and generating an error signal if at least one bit of the word to be written in the programmed state is different from the corresponding bit read. Application of the method can be particularly but not exclusively to integrated circuits for chip cards.

25 Claims, 2 Drawing Sheets

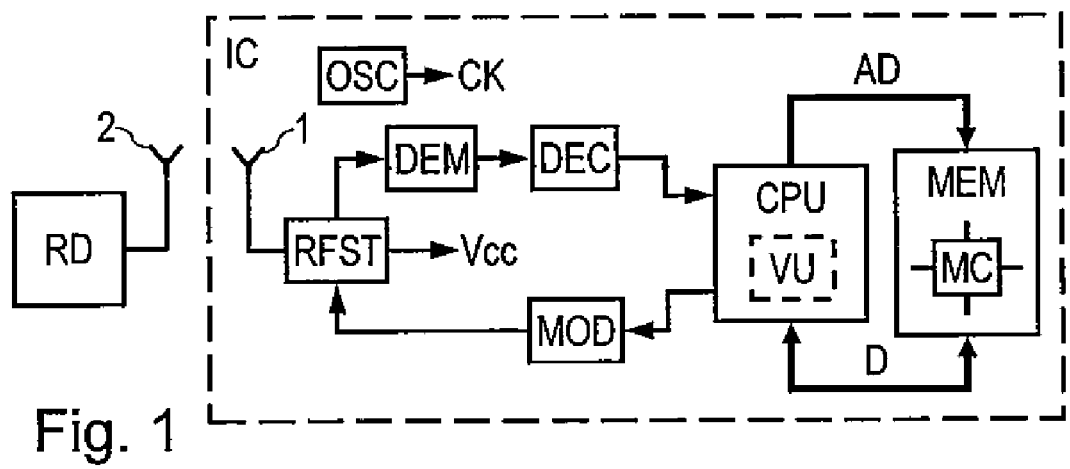
Fig. 1
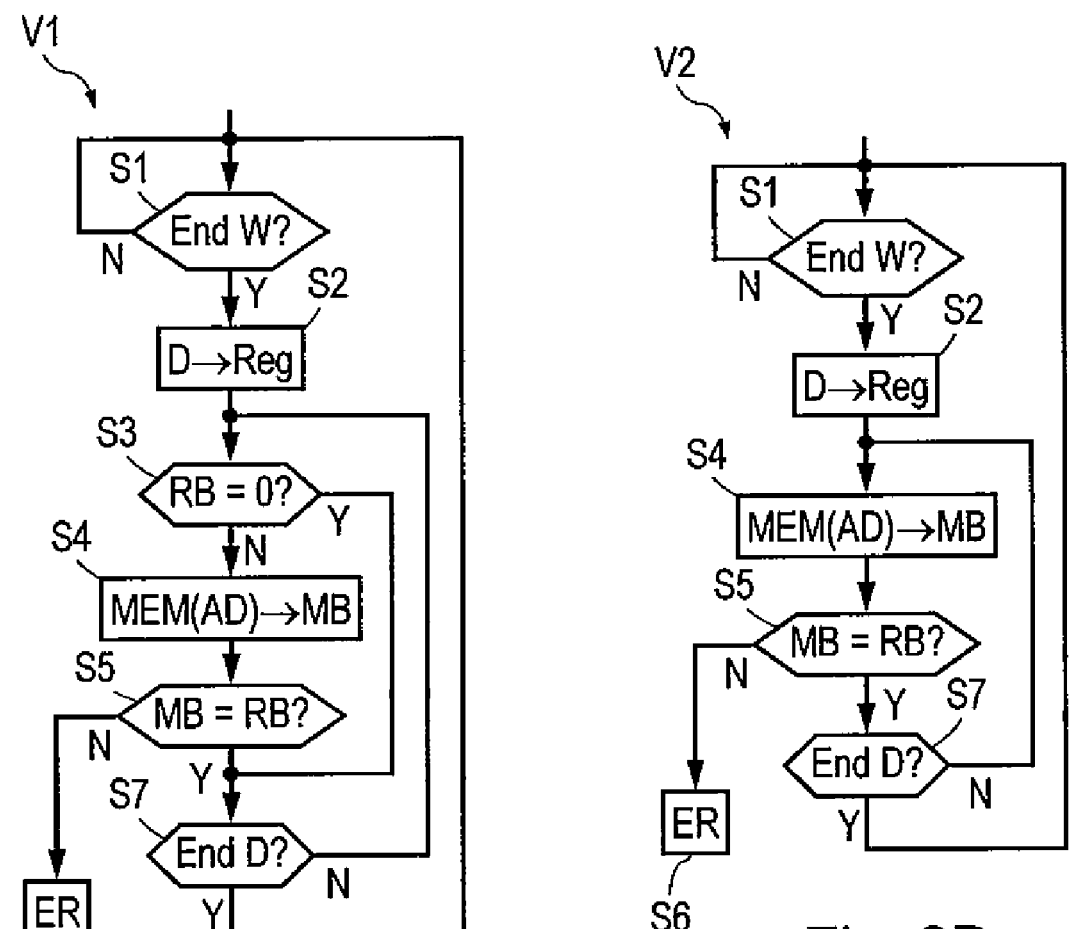
Fig. 2A
Fig. 2B

METHOD AND DEVICE FOR CHECKING THE EXECUTION OF A WRITE COMMAND FOR WRITING IN A MEMORY

TECHNICAL FIELD

The present disclosure generally relates to an integrated circuit comprising an electrically programmable memory and a processing unit for executing commands for reading and writing the memory.

The present disclosure particularly but not exclusively relates to integrated circuits for contact or contactless chip cards or even integrated circuits used in specific applications such as odometers for automobiles, for example.

BACKGROUND INFORMATION

Depending on the applications and on the type of memory used, there are several writing modes for writing a word in a memory. In a first writing mode, the memory cells provided for storing the bits of the word to be written are previously erased. Then, the memory cells corresponding to the bits in the programmed state of the word to be written are programmed. In a second writing mode, a word is written in the memory by directly programming the memory cells corresponding to the bits in the programmed state of the word to be written, without any prior erasing operation. Thus, only the memory cells that were in the erased state before the programming and which correspond, by their rank, to bits in the programmed state of the word to be written, change state. This writing mode is particularly used in abacus-type counters, such as automobile odometers for example, or in event storing or counting applications.

In certain applications such as contactless chips, a reader sends write commands in the form of electromagnetic waves to an integrated circuit electrically powered using the radioelectric field radiated by the reader. In these applications, transmission errors can occur due to electromagnetic disturbances. Write errors can also occur in the memory, particularly due to an insufficient supply voltage of the integrated circuit, when the latter is situated at the limit of the radioelectric field radiated by the reader. It is therefore desirable to make sure that a write command has effectively been executed by the integrated circuit.

Generally speaking, the execution of a write command is checked by sending a read command to the integrated circuit for reading the memory cells of the word that has been written in the memory. In the case of a contactless chip card integrated circuit, the writing report issued by the integrated circuit is awaited before sending the verification read command. Then, there is the waiting for the word read in response to the read command to be received, and to compare the word read with the word to be written. Certain integrated circuits only comprise one sense amplifier. A word is therefore read bit by bit. The writing of a word in a memory including the execution of such a verification procedure can thus be relatively long.

Furthermore, certain integrated circuits support the two writing modes previously described. In the writing mode with prior erasing, the verification of the writing involves checking the equality of the value of each bit of the word to be written and of the word read after writing. In the writing mode without prior erasing, this verification procedure cannot be applied, owing to the fact that certain bits in the erased state of the word to be written may, on the contrary, be in the programmed state in the word read after writing.

BRIEF SUMMARY

Thus, one embodiment of the present invention provides a method for checking the execution of a write command for writing in an integrated circuit memory, in which the sender of the write command is not involved.

Another embodiment of the present invention provides a method for checking the execution of a write command for writing in an integrated circuit memory, which is adapted to the verification of a write command without prior erasing.

Yet another embodiment of the present invention provides a method for checking the execution of a write command, which is compatible with the two writing modes with and without prior erasing.

A method for executing a write command for writing a binary word in a programmable memory, comprises writing each of the bits in a programmed state of a binary word to be written in a corresponding memory cell of the memory.

According to one embodiment of the present invention, the method comprises:
  reading each bit of the word written in the memory corresponding to a bit in the programmed state of the word to be written, and
  comparing each bit in the programmed state of the word to be written with a corresponding bit read in the memory.

According to one embodiment of the present invention, the word is written in the memory, without prior erasing of the memory cells in which the bits of the word to be written are stored.

Alternatively, one embodiment of the method comprises:
  prior to the writing, erasing the memory cells in which the bits of the word to be written are to be stored,
  following the writing, reading each bit of the word written in the memory, and
  comparing each bit read with a corresponding bit of the word to be written.

According to one embodiment of the present invention, a configuration parameter determines whether or not a word is written in the memory with prior erasing of the memory cells in which the bits of the word to be written are stored, the method comprising:
  reading the value of the configuration parameter, and
  comparing with a corresponding bit read in the memory, each bit of the word to be written, or only each bit in the programmed state of the word to be written, depending on the value of the configuration parameter.

According to one embodiment of the present invention, the method comprises generating an error signal if at least one bit of the word to be written in the programmed state is different from the corresponding bit read.

According to one embodiment of the present invention, the error signal is maintained until the application of an initialization signal.

According to one embodiment of the present invention, the method comprises re-executing the write command with verification of the writing, if at least one bit of the word to be written in the programmed state is different from the corresponding bit read.

According to one embodiment of the present invention, the word is written in the memory bit by bit, and the verification of the writing is performed after the programming of each bit to be programmed of the word to be written, and concerns the bit written in the memory.

One embodiment of the present invention also relates to an integrated circuit comprising an electrically programmable memory and a processing unit for executing write commands for writing a binary word in the memory.

According to an embodiment of the present invention, the integrated circuit comprises:

read means for reading each bit of a word written in the memory corresponding to a bit in a programmed state of a word to be written in the memory, and comparison means for comparing each bit in the programmed state of the word to be written with a corresponding bit read in the memory.

According to one embodiment of the present invention, the word is written in the memory, without prior erasing of the memory cells in which the bits of the word to be written are stored.

Alternatively, the word is written in the memory with prior erasing of the memory cells in which the bits of the word to be written are stored, the read means reading each bit of a word written in the memory, and the comparison means comparing each bit in the programmed state of the word to be written with a corresponding bit read in the memory.

According to one embodiment of the present invention, a configuration parameter determines whether or not a word is written in the memory with prior erasing of the memory cells in which the bits of the word to be written are stored, the integrated circuit comprising storing and reading means for storing and reading the value of the configuration parameter, the comparison means comparing with a corresponding bit read in the memory, each bit of the word to be written, or only each bit in the programmed state of the word to be written, depending on the value of the configuration parameter.

According to one embodiment of the present invention, the integrated circuit comprises means for generating an error signal if at least one bit of the word to be written in the programmed state is different from the corresponding bit read.

According to one embodiment of the present invention, the integrated circuit comprises means for maintaining the error signal until the application of an initialization signal to the generation means for generating an error signal.

According to one embodiment of the present invention, the integrated circuit comprises means for re-executing the write command with verification of the writing, if at least one bit of the word to be written in the programmed state is different from the corresponding bit read.

According to one embodiment of the present invention, the integrated circuit comprises send and receive circuits for receiving commands for writing and reading in the memory in the form of modulated RF signals, and a power supply circuit for generating, using the RF signals received, a supply voltage for powering the integrated circuit.

According to one embodiment of the present invention, the memory is an electrically programmable and erasable memory.

According to one embodiment of the present invention, the memory comprises a single sense amplifier.

BRIEF DESCRIPTION OF THE SEVERAL VIEWS OF THE DRAWINGS

These features of the present invention will be explained in greater detail in the following description of non-exhaustive embodiments of the present invention, given in relation with, but not limited to the following figures, in which:

FIG. 1 represents in block form an integrated circuit for contactless chip card according to the one embodiment of the present invention, FIGS. 2A and 2B are flowcharts showing one embodiment of the method according to the present invention.

DETAILED DESCRIPTION

Figure 3:
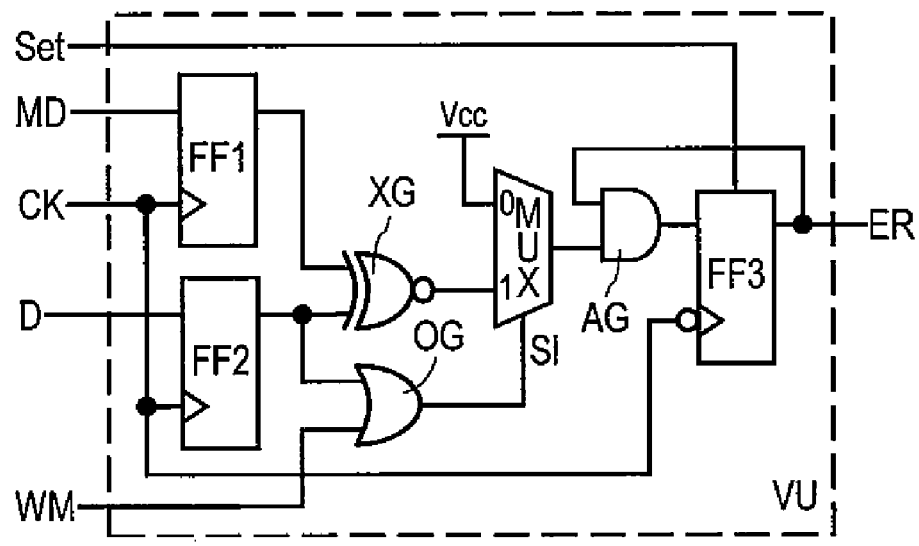
FIG. 3 represents a write verification circuit according to one embodiment of the present invention.

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

FIG. 1 represents an embodiment of an integrated circuit IC for RFID-type (Radio-Frequency Identification) chip card. The integrated circuit IC comprises a processing unit CPU connected to a memory MEM. The processing unit communicates with an external reader RD coupled to an antenna 2, using an antenna 1 connected to a radiofrequency stage RFST. The stage RFST is connected to a demodulator DEM and to a modulator MOD. The demodulator is connected to a decoder DEC that supplies the processing unit CPU with commands and data, received and demodulated. The modulator MOD modulates data supplied by the processing unit CPU and applies the modulated data to the stage RFST with a view to them being sent to the reader RD.

Furthermore, the stage RFST produces a direct voltage Vcc to supply the integrated circuit IC, using a radioelectric field radiated by the reader RD. The integrated circuit IC also comprises a clock signal generator OSC that supplies a clock signal CK pacing the demodulator, the processing unit CPU and the memory MEM in particular.

The processing unit CPU is for example produced in hard-wired logic. The memory MEM comprises memory cells MC arranged according to horizontal and vertical lines and linked to word lines and to bit lines. The memory MEM of one embodiment is for example of EEPROM-type (Electrically Erasable Programmable Read Only Memory), the memory cells being electrically erasable and programmable. For the sake of saving space in particular, the memory MEM of one embodiment may comprise a single sense amplifier. In this case, a read command for reading a word is executed bit by bit.

The processing unit CPU is connected to the memory MEM by address and data buses, enabling the transmission of a physical address AD to be accessed in the memory, and a word D to be stored or read in the memory at the physical address.

According to one embodiment of the present invention, the processing unit CPU comprises a verification unit VU used to check that a write command for writing in the memory MEM has effectively been executed. The unit VU is activated to perform a writing check at the end of each write in the memory and before the sending of any message reporting on the execution of the write command.

FIGS. 2A and 2B are flowcharts showing verification procedures V1, V2 conforming to one or more embodiments of the method according to the present invention, these procedures being executed by the unit VU. The procedure V1 represented in FIG. 2A comprises the following steps:

step S1: detecting the end of the writing of a word D in the memory MEM,
step S2: loading the word to be written D into a register Reg,
step S3: testing the programmed/erased value of a bit of the word to be written,
step S4: reading a bit MB of the word written in the memory MEM,
step S5: comparing a bit RB of the word D with a bit MB,
step S6: generating an error signal ER, and
step S7: detecting the end of the word to be written.

In step S1, the unit VU waits for the end of the writing of a word in the memory MEM. In step S2, the word D received in the write command is loaded into a register Reg. This step is not necessary if the word to be written was stored in a register before the word was written in the memory.

In steps S3 to S6, the unit VU successively examines each of the bits of the word D. In step S3, the unit VU tests whether the bit RB of the word D stored in the register Reg is in the erased or programmed state. If the bit RB is in the programmed state (on 1), the unit VU reads the corresponding bit MB, e.g., of the same rank, of the word written in the memory MEM (step S4). In the next step S5, the unit VU tests the equality between the bits RB and MB. If these two bits are different, a writing error has occurred and the unit VU sends an error signal ER (step S6). On the contrary, if the bits RB and MB are equal, the procedure proceeds to step S7 where the unit VU determines whether or not all the bits of the word written have been tested. If all the bits of the word written have been tested, the procedure V1 ends and the unit VU waits for the end of a new write command (step S1). In the opposite case, the unit VU checks the next bit of the word written by returning to step S3.

Providing step S4 is advantageous in one embodiment if the memory is read-accessible bit by bit (memory with a single sense amplifier), because only the bits MB that correspond to a bit RB in the programmed state in the word to be written D are read in the memory. Alternatively and in particular for one embodiment if the memory is word-accessible, the word to be checked, written in the memory, can be read beforehand and temporarily stored in a register. In this case, the verification procedure V1 does not comprise any step S4 of reading a bit in the memory MEM.

The verification procedure V2 shown in FIG. 2B is identical to the procedure V1, except that the procedure V2 is provided for systematically testing all the bits of the word written. Thus, it does not comprise any step S3 of testing the erased/programmed value of the bit RB of the word to be written D, followed by a conditional branch in step S7.

One or other of the procedures V1, V2 is selected by the processing unit CPU according to a writing mode. Thus, the procedure V1 is selected if the word to be checked was written without prior erasing (setting to 0) of the memory cells used to store the word. The procedure V1 only checks the bits RB of the word to be written that are in the programmed state (on 1). On the contrary, the procedure V2 that checks all the bits RB of the word to be written, is performed after a write in mode with prior erasing (setting to 0) of the memory cells used to store the bits of the word.

It shall be noted that the verification procedure V1 is compatible with the two writing modes, with and without prior erasing. It is merely incomplete in the case of the writing mode with prior erasing, due to the fact that the bits in the erased state of the word to be written are not tested.

FIG. 3 represents one embodiment of the unit VU in the form of a logic circuit. The unit VU comprises three flip-flops FF1, FF2, FF3 paced by a clock signal CK. The flip-flop FF1 receives at input, in series form, the bits MB read in the memory MEM of the word written to be checked MD, while the flip-flop FF2 receives at input, also in series form, the bits RB of the word to be written D stored in the register Reg. The outputs of the two flip-flops FF1, FF2 are connected to the inputs of an inverted exclusive OR-type logic gate XG. The output of the gate XG is connected to an input of a multiplexer MUX, another input of which is connected to the power source Vcc. The multiplexer MUX is controlled by a selection signal S1 coming from an OR-type logic gate OG, the inputs of which are connected to the output of the flip-flop FF2 and to an input of the circuit VU receiving a writing mode signal WM generated for example using a configuration parameter of the integrated circuit IC. The output of the multiplexer is connected to an input of an AND-type logic gate AG, the output of which is connected to the input of the flip-flop FF3. The output of the flip-flop FF3 supplies the error signal ER and is connected to an input of the gate AG. The flip-flop FF3 is set to 1 by a signal Set.

Figure 4:
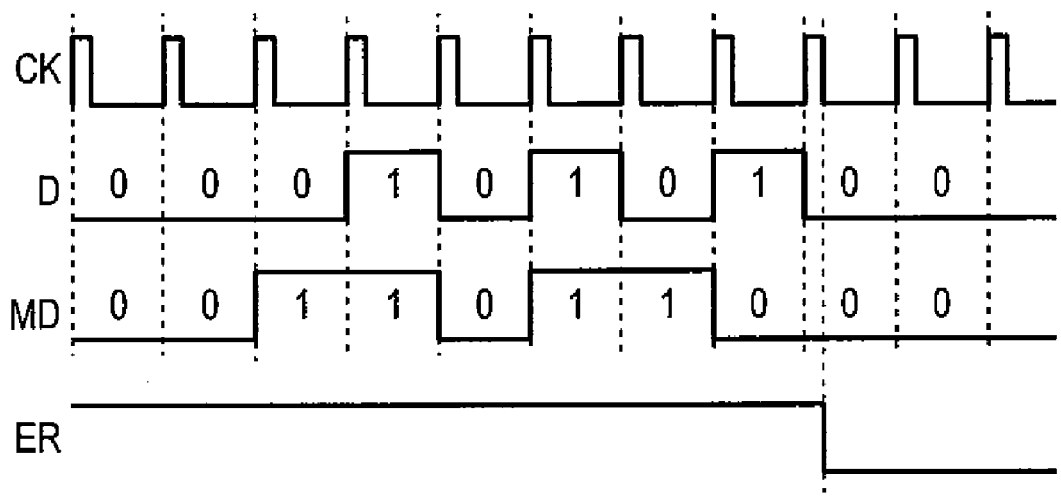
FIG. 4 represents timing diagrams showing the operation of one embodiment of the writing circuit.

The operation of an embodiment of the circuit VU is shown by the timing diagrams represented in FIG. 4. When initializing the circuit, the flip-flop FF3 is set to 1. The result is that the signal ER is also on 1. Upon each rising edge of the clock signal CK, the flip-flops FF1, FF2 save the value of a bit MB, RB of the same rank of the word MD written in the memory MEM, and of the word to be written D, stored in the register Reg. The state of the flip-flops FF1 and FF2 is compared by the gate XG. The output signal of the gate XG is on 1 or 0 depending on whether or not the bits MB, RB are equal. The multiplexer MUX enables the output of the gate XG to be forced to 1 when the bit RB of the word to be written is in the erased state (on 0) and when the writing mode is the mode without prior erasing (signal WM on 0). While the bits MB and RB are equal, or while the mode without prior erasing is selected and the bit RB is in the erased state (on 0), the output signal ER of the flip-flop FF3 remains on 1. On the contrary, if the bits MB and RB are different, the output of the gate XG changes to 0 and the output signal ER of the flip-flop FF3 also changes to 0. The state on 0 of the flip-flop FF3, and therefore of the signal ER, is maintained by the gate AG until the circuit VU is initialized by the signal Set.

In the example in FIG. 4, the signal WM is on 0. The bits RB and MB of the word to be written D and of the word written MD in the memory MEM are successively equal to:

D: 0001010100, and

MD: 0011011000.

Up to the seventh rank, either the bits RB and MB of the words D and MD are identical, or the bits RB are on 0. The result is that the error signal ER remains on 1. At the eighth rank, the bit RB of the word to be written D is on 1, and the bit MB of the word MD is on 0. As a result, the signal ER changes to 0, thus revealing a writing error in the memory MEM. The signal ER remains in this state even if the next bits of the words D and MD are identical thanks to the gate AG.

The error signal ER is for example used by the unit CPU to constitute a writing report message that is sent by the integrated circuit IC to the reader RD.

Provision can also be made for the processing unit CPU to make several attempts at writing the word before indicating a writing error in the report message.

As a result of these provisions, the proper execution of a write command is checked without the reader RD needing to send a read command to the integrated circuit IC, and without the integrated circuit IC sending a message other than the one that is provided in response to a write command.

If the integrated circuit IC is configurable in writing mode without prior erasing, provision can be made for the integrated circuit to be able to execute commands for erasing one or more words in the memory MEM. In this case, the execution of an erase command may also comprise the execution of a verification procedure such as the procedure V2, to check that all the memory cells addressed by the erase command have been properly erased. The circuit in FIG. 3 can also be used to check an erase command for erasing the memory.

It will be understood by those skilled in the art that various alternative embodiments and applications of the present invention are possible. Thus, the present invention is not limited to erasable memories. It can also be applied to non-erasable memories. In this case, only the memory cells corresponding to a bit in the programmed state in the word to be written must be checked. In addition, there is no need to provide a writing mode signal WM, since the memory only accepts the writing mode without prior erasing.

If a writing error is detected, it is not essential for the error signal to be maintained or for the verification procedure V1, V2 to be stopped. Indeed, the detection of an error can simply be indicated to the processing unit, which can thus make another attempt at writing the invalid bit, followed by a verification of the writing.

A word can alternatively be written bit by bit in the memory, and the writing can be checked after the programming of each bit to be programmed of the word to be written. In this case, the verification procedure only comprises steps S4 to S6.

Furthermore, the correspondence between the programmed/erased state of a memory cell and the corresponding value 0 or 1 of the bit stored by the memory cell is merely a simple convention. It goes without saying that a reverse convention can be used while remaining within the framework of the present invention.

One or more embodiments of the present invention can be applied more generally to any device comprising an electrically programmable memory.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A method for executing a write command for writing a binary word in a programmable memory, the method comprising successively:
   erasing memory cells in which bits of the binary word to be written are to be stored, if a write mode configuration parameter has a value indicating that a word is written in the memory with prior erasing of said memory cells in which the bits of the binary word to be written are to be stored;
   writing each of a plurality of bits in a programmed state of the binary word to be written in a corresponding memory cell of the memory;
   reading each bit of the binary word written in the memory, or only each bit of the binary word written in the memory corresponding to a bit in the programmed state of the binary word to be written, depending on the value of the write mode configuration parameter; and
   comparing each bit read from the memory with a corresponding bit of the binary word to be written.

2. The method according to claim 1, further comprising generating an error signal if at least one bit of the binary word to be written in the programmed state is different from a corresponding bit read.

3. The method according to claim 2 wherein the error signal is maintained until application of an initialization signal.

4. The method according to claim 1, further comprising re-executing the write command with verification of the writing, if at least one bit of the binary word to be written in the programmed state is different from the corresponding bit read.

5. The method according to claim 1 wherein the binary word is written in the memory bit by bit, and verification of the writing is performed after programming of each bit to be programmed of the binary word to be written, and concerns the bit written in the memory.

6. An integrated circuit, comprising:
   an electrically programmable memory and a processing unit to execute write commands to write a binary word in the memory;
   a write mode configuration parameter to determine whether a word is written in the memory with or without prior erasing of memory cells in which bits of the binary word to be written are to be stored;
   write means for writing each of a plurality of bits in a programmed state of the binary word to be written in the memory;
   erase means for erasing the memory cells in which the bits of the binary word to be written are to be stored, depending on a value of the write mode configuration parameter; and
   comparison means for comparing each bit of the binary word to be written, or only each bit in the programmed state of the binary word to be written, with a corresponding bit read from the memory, depending on the value of the write mode configuration parameter.

7. The integrated circuit according to claim 6, further comprising storage means for storing said value of the configuration parameter.

8. The integrated circuit according to claim 6, further comprising means for generating an error signal if at least one bit of the binary word to be written in the programmed state is different from a corresponding bit read.

9. The integrated circuit according to claim 8, further comprising means for maintaining the error signal until application of an initialization signal to the means for generating said error signal.

10. The integrated circuit according to claim 6, further comprising means for re-executing a write command with verification of writing, if at least one bit of the binary word to be written in the programmed state is different from the corresponding bit read.

11. The integrated circuit according to claim 6, further comprising circuitry to receive commands to write and read in the memory in a form of modulated RF signals, and a power supply circuit to generate, using the RF signals received, a supply voltage to power the integrated circuit.

12. The integrated circuit according to claim 6 wherein the memory includes an electrically programmable and erasable memory.

13. The integrated circuit according to claim 6 wherein the memory includes a single sense amplifier.

14. An apparatus, comprising:
a memory and a register;
a processing unit coupled to the memory and to the register to execute a write command to write a binary word in the memory with or without a prior erasure of memory cells of the memory where bits of said binary word to be written are to be stored, a programmed state of each of a plurality of said bits of said binary word to be written being loaded in the register;
store and read circuitry adapted to respectively store and read a value of a write mode configuration parameter that determines whether a word is written in the memory with or without prior erasure of said memory cells where the bits of the binary word to be written are to be stored; and
a verification unit adapted to read each bit of said binary word written in the memory, or to read only each bit of the binary word written in the memory corresponding to a bit in the programmed state loaded in the register, depending on the value of the configuration parameter, and adapted to compare each bit read with a corresponding bit loaded in the register.

15. The apparatus of claim 14 wherein the verification unit includes:
a first flip flop coupled to the memory to receive each bit of the binary word written in the memory and read therefrom;
a second flip flop coupled to the register to receive each bit of the binary word loaded in the register and read therefrom;
a first logic gate coupled to the first and second flip flops to receive outputs from the first and second flip flops;
a multiplexer coupled to the first logic gate to receive an output from the first logic gate;
a second logic gate coupled to the multiplexer to receive an output from the multiplexer; and
a third flip flop coupled to the second logic gate to receive an output from the second logic gate and to generate an output error signal indicative of whether each bit read from the memory equals each corresponding bit loaded in the register.

16. A system, comprising:
a memory and a register;
a processing unit coupled to the memory and to the register to execute a write command to write a binary word in the memory, a programmed state of said word to be written being loaded in the register;
a verification unit to read each bit of said word written in the memory and to compare each bit that is read with a corresponding bit that is loaded in the register;
modulator/demodulator blocks coupled to the processing unit;
a radiofrequency stage coupled to the modulator/demodulator blocks; and
a reader device that is adapted to communicate with the radiofrequency stage to provide data corresponding to the word to be written.

17. The system of claim 16 wherein the verification unit includes:
a first flip flop coupled to the memory to receive each bit of the word written in the memory and read therefrom;
a second flip flop coupled to the register to receive each bit of the word loaded in the register and read therefrom;
a first logic gate coupled to the first and second flip flops to receive outputs from the first and second flip flops;
a multiplexer coupled to the first logic gate to receive an output from the first logic gate;
a second logic gate coupled to the multiplexer to receive an output from the multiplexer; and
a third flip flop coupled to the second logic gate to receive an output from the second logic gate and to generate an output error signal indicative of whether each bit read from the memory equals each corresponding bit loaded in the register.

18. The system of claim 16 wherein a configuration parameter determines whether a word is written in the memory with prior erasure of memory cells in which the bits of the word to be written are stored, the apparatus further comprising storing and reading circuitry to store and read a value of the configuration parameter, the verification unit being adapted to compare with a corresponding bit read in the memory, each bit of the word to be written, or only each bit in the programmed state of the word to be written, depending on the value of the configuration parameter.

19. The system of claim 16 wherein the verification unit is included in the processing unit.

20. The system of claim 16 wherein the verification unit is adapted to perform different types of comparisons based on whether bits of the word are written in the memory with prior erasure of corresponding memory cells of the memory.

21. An apparatus, comprising:
a memory and a register;
a processing unit coupled to the memory and to the register to execute a write command to write a binary word in the memory, a programmed state of said word to be written being loaded in the register; and
a verification unit to read each bit of said word written in the memory and to compare each bit that is read with a corresponding bit that is loaded in the register, wherein said verification unit includes:
a first flip flop coupled to the memory to receive each bit of the word written in the memory and read therefrom;
a second flip flop coupled to the register to receive each bit of the word loaded in the register and read therefrom;
a first logic gate coupled to the first and second flip flops to receive outputs from the first and second flip flops;
a multiplexer coupled to the first logic gate to receive an output from the first logic gate;
a second logic gate coupled to the multiplexer to receive an output from the multiplexer; and
a third flip flop coupled to the second logic gate to receive an output from the second logic gate and to generate an output error signal indicative of whether each bit read from the memory equals each corresponding bit loaded in the register.

22. The apparatus of claim 21, further comprising a third logic gate having an input terminal coupled to an output terminal of said second flip-flop and having an output terminal coupled to a control terminal of said multiplexer.

23. The apparatus of claim 21 wherein the word is written in the memory, without prior erasure of memory cells of the memory where bits of said word are stored.

24. The apparatus of claim 21 wherein the word is written in the memory, with prior erasure of memory cells of the memory where bits of said word are stored.

25. The apparatus of claim 15, further comprising a third logic gate having an input terminal coupled to an output terminal of said second flip-flop and having an output terminal coupled to a control terminal of said multiplexer.

* * * * *

UNITED STATES PATENT AND TRADEMARK OFFICE
CERTIFICATE OF CORRECTION

| | | |
|---|---|---|
| PATENT NO. | : 7,447,080 B2 | Page 1 of 1 |
| APPLICATION NO. | : 11/610628 | |
| DATED | : November 4, 2008 | |
| INVENTOR(S) | : Ahmed Kari et al. | |

It is certified that error appears in the above-identified patent and that said Letters Patent is hereby corrected as shown below:

Title Page,
Item (56) References Cited, under U.S. Patent Documents, two references should be added to read as -- 4,727,509...2/1988...Johnson et al.......360/15 -- and -- 204/0264250...12/2004...Zink et al.......365/185.22 --

Signed and Sealed this

Twenty-seventh Day of July, 2010

David J. Kappos
*Director of the United States Patent and Trademark Office*